(12) United States Patent
Chindo et al.

(10) Patent No.: US 11,050,429 B2
(45) Date of Patent: Jun. 29, 2021

(54) ATOMIC OSCILLATOR AND FREQUENCY SIGNAL GENERATION SYSTEM

(71) Applicant: SEIKO EPSON CORPORATION, Tokyo (JP)

(72) Inventors: Koji Chindo, Chino (JP); Nobuhito Hayashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/831,469

(22) Filed: Mar. 26, 2020

(65) Prior Publication Data
US 2020/0313682 A1 Oct. 1, 2020

(30) Foreign Application Priority Data

Mar. 27, 2019 (JP) .............................. JP2019-061467

(51) Int. Cl.
*H03B 17/00* (2006.01)
*H03L 1/02* (2006.01)
*H03L 7/26* (2006.01)

(52) U.S. Cl.
CPC ............... *H03L 7/26* (2013.01); *H03B 17/00* (2013.01); *H03L 1/02* (2013.01)

(58) Field of Classification Search
CPC ........... G04F 5/14; G04F 5/145; H03B 17/00; H03L 1/02; H03L 7/26
(Continued)

(56) References Cited

U.S. PATENT DOCUMENTS

2014/0070895 A1* 3/2014 Chindo ............... H03B 17/00
                                                          331/94.1
2015/0349791 A1 12/2015 Nakajima
(Continued)

FOREIGN PATENT DOCUMENTS

JP    H10-281883 A    10/1998
JP    2015-231053 A   12/2015
(Continued)

*Primary Examiner* — Levi Gannon
(74) *Attorney, Agent, or Firm* — Rankin, Hill & Clark LLP

(57) ABSTRACT

An atomic oscillator includes an atom cell that includes a first portion and a second portion at a position different from the first portion, and contains alkali metal atoms, a light emitting element that emits light for exciting the alkali metal atoms toward the atom cell, a first temperature measurement element that measures the temperature of the first portion, a first temperature control element that controls a temperature of the first portion based on the measurement result of the first temperature measurement element, a second temperature measurement element that is disposed in a portion having thermal resistance equal to or higher than thermal resistance between the first portion and the second portion, and measures a temperature of the portion, a second temperature control element that controls the temperature of the second portion to be higher than the temperature of the first portion based on the measurement result of the second temperature measurement element or information on temperature control performed by the first temperature control element, and a light receiving element that receives light transmitted through the atom cell.

5 Claims, 11 Drawing Sheets

(58) Field of Classification Search
USPC .................................................... 331/3, 94.1
See application file for complete search history.

(56) References Cited

U.S. PATENT DOCUMENTS

| | | |
|---|---|---|
| 2017/0141783 A1 | 5/2017 | Tanaka et al. |
| 2019/0131985 A1* | 5/2019 | Ishihara .................... H03L 7/26 |
| 2019/0181871 A1* | 6/2019 | Matsuda .................... H01S 1/06 |
| 2019/0334535 A1* | 10/2019 | Maki ......................... H03L 7/26 |
| 2019/0334536 A1* | 10/2019 | Chindo ................... G04F 5/145 |

FOREIGN PATENT DOCUMENTS

| | | |
|---|---|---|
| JP | 2017-059865 A | 3/2017 |
| JP | 2017-092796 A | 5/2017 |

\* cited by examiner

FIG. 4
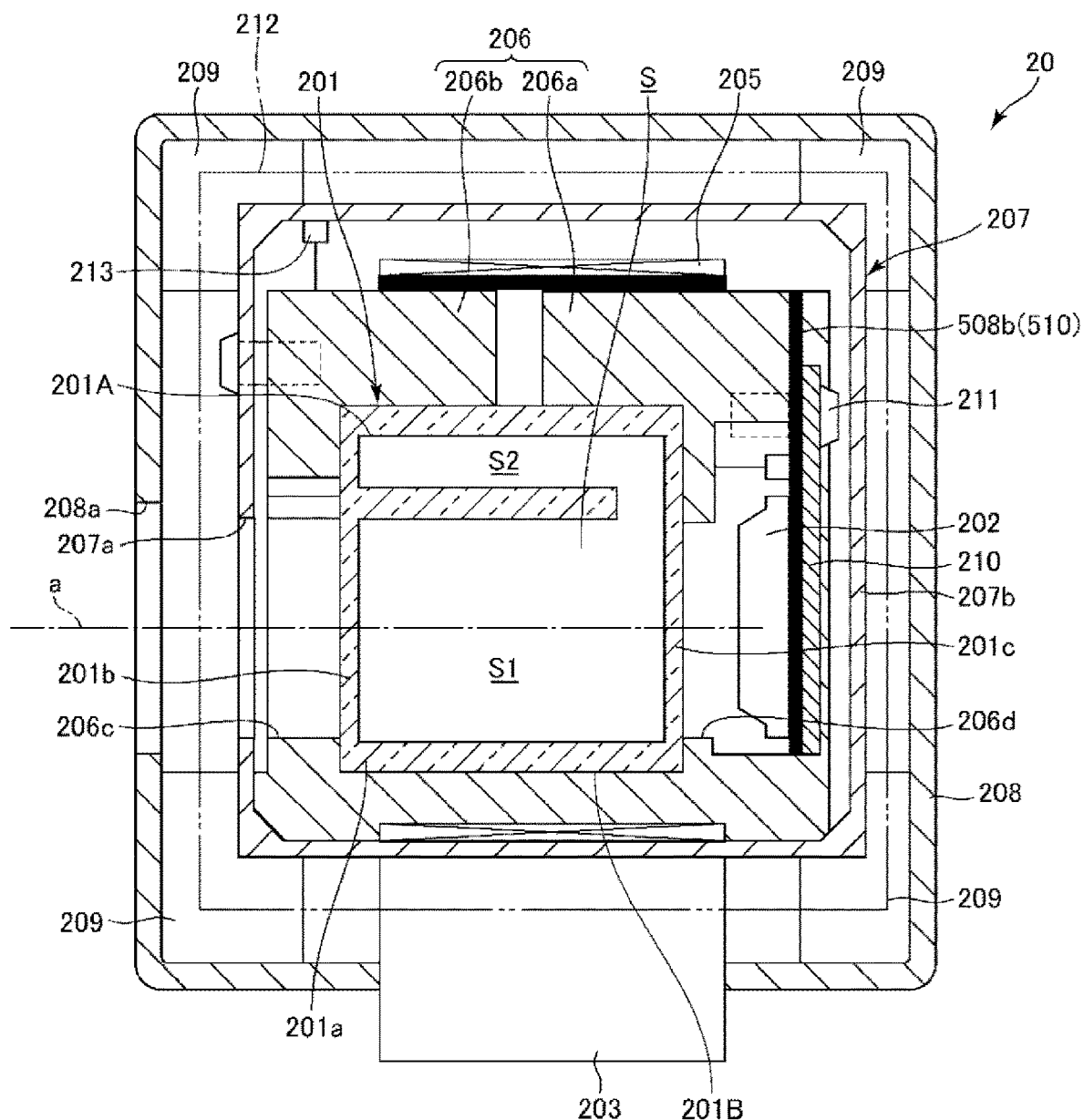
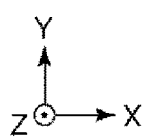

ATOMIC OSCILLATOR AND FREQUENCY SIGNAL GENERATION SYSTEM

The present application is based on, and claims priority from JP Application Serial Number 2019-061467, filed Mar. 27, 2019, the disclosure of which is hereby incorporated by reference herein in its entirety.

BACKGROUND

1. Technical Field

The present disclosure relates to an atomic oscillator and a frequency signal generation system.

2. Related Art

An atomic oscillator that oscillates based on energy transition of alkali metal atoms such as rubidium and cesium is known. For example, an optical frequency reference cell device described in JP-A-10-281883 is used for an atomic oscillator and includes a cell which includes a first cell portion and a second cell portion and in which alkali metal atoms are enclosed, a first temperature measurement element that measures a temperature of the first cell portion, a first temperature control section that controls the temperature of the first cell portion based on the measurement result of the first temperature measurement element, a second temperature measurement element that measures a temperature of the second cell portion, and a second temperature control section that controls the temperature of the second cell portion based on the measurement result of the second temperature measurement element. The temperature of the second cell portion is set to be 10 to 15° C. lower than the temperature of the first cell portion by the first temperature control element and the second temperature control element. With this configuration, metal vapor pressure in the cell can be controlled.

However, in the optical frequency reference cell device described in JP-A-10-281883, the measurement result of the first temperature measurement element is fed back to the first temperature control element and the measurement result of the second temperature measurement element is fed back to the second temperature control element, and thus the temperature controls may interfere with each other, the controls may not converge, and the cell temperature may become unstable. As a result, frequency stability of the atomic oscillator may be reduced.

SUMMARY

The present disclosure can be implemented as the following application examples.

An atomic oscillator according to an application example includes an atom cell that includes a first portion and a second portion at a position different from the first portion, and contains alkali metal atoms, a light emitting element that emits light for exciting the alkali metal atoms toward the atom cell, a first temperature measurement element that measures a temperature of the first portion, a first temperature control element that controls the temperature of the first portion based on a measurement result of the first temperature measurement element, a second temperature measurement element that is disposed in a portion having a thermal resistance equal to or higher than a thermal resistance between the first portion and the second portion, and measures a temperature of the portion, a second temperature control element that controls a temperature of the second portion to be higher than the temperature of the first portion based on a measurement result of the second temperature measurement element or information on temperature control performed by the first temperature control element, and a light receiving element that receives light transmitted through the atom cell.

An atomic oscillator according to an application example includes an atom cell that includes a first portion and a second portion at a position different from the first portion, and contains alkali metal atoms, a light emitting element that emits light for exciting the alkali metal atoms toward the atom cell, a first temperature measurement element that measures a temperature of the first portion, a first temperature control element that controls the temperature of the first portion based on a measurement result of the first temperature measurement element, a second temperature control element that controls the second portion to a temperature higher than the temperature of the first portion with a predetermined output value, and a light receiving element that receives light transmitted through the atom cell.

A frequency signal generation system according to an application example includes an atomic oscillator and a processor that processes a frequency signal from the atomic oscillator, in which the atomic oscillator includes an atom cell that includes a first portion and a second portion at a position different from the first portion, and contains alkali metal atoms, a light emitting element that emits light for exciting the alkali metal atoms toward the atom cell, a first temperature measurement element that measures a temperature of the first portion, a first temperature control element that controls the temperature of the first portion based on a measurement result of the first temperature measurement element, a second temperature measurement element that is disposed in a portion having a thermal resistance equal to or higher than a thermal resistance between the first portion and the second portion, and measures a temperature of the portion, a second temperature control element that controls the temperature of the second portion to be higher than the temperature of the first portion based on a measurement result of the second temperature measurement element or information on temperature control performed by the first temperature control element, and a light receiving element that receives light transmitted through the atom cell.

A frequency signal generation system according to an application example includes an atomic oscillator and a processor that processes a frequency signal from the atomic oscillator, in which the atomic oscillator includes an atom cell that includes a first portion and a second portion at a position different from the first portion, and contains alkali metal atoms, a light emitting element that emits light for exciting the alkali metal atoms toward the atom cell, a first temperature measurement element that measures a temperature of the first portion, a first temperature control element that controls the temperature of the first portion based on the measurement result of the first temperature measurement element, a second temperature control element that controls the second portion to a temperature higher than the temperature of the first portion with a predetermined output value, and a light receiving element that receives light transmitted through the atom cell.

BRIEF DESCRIPTION OF THE DRAWINGS

FIG. 4 is a cross-sectional view taken along the XY plane of an atom cell unit provided in the atomic oscillator according to the first embodiment.

DESCRIPTION OF EXEMPLARY EMBODIMENTS

Hereinafter, an atomic oscillator and a frequency signal generation system according to the present disclosure will be described in detail based on embodiments illustrated in the accompanying drawings.

Figure 1:
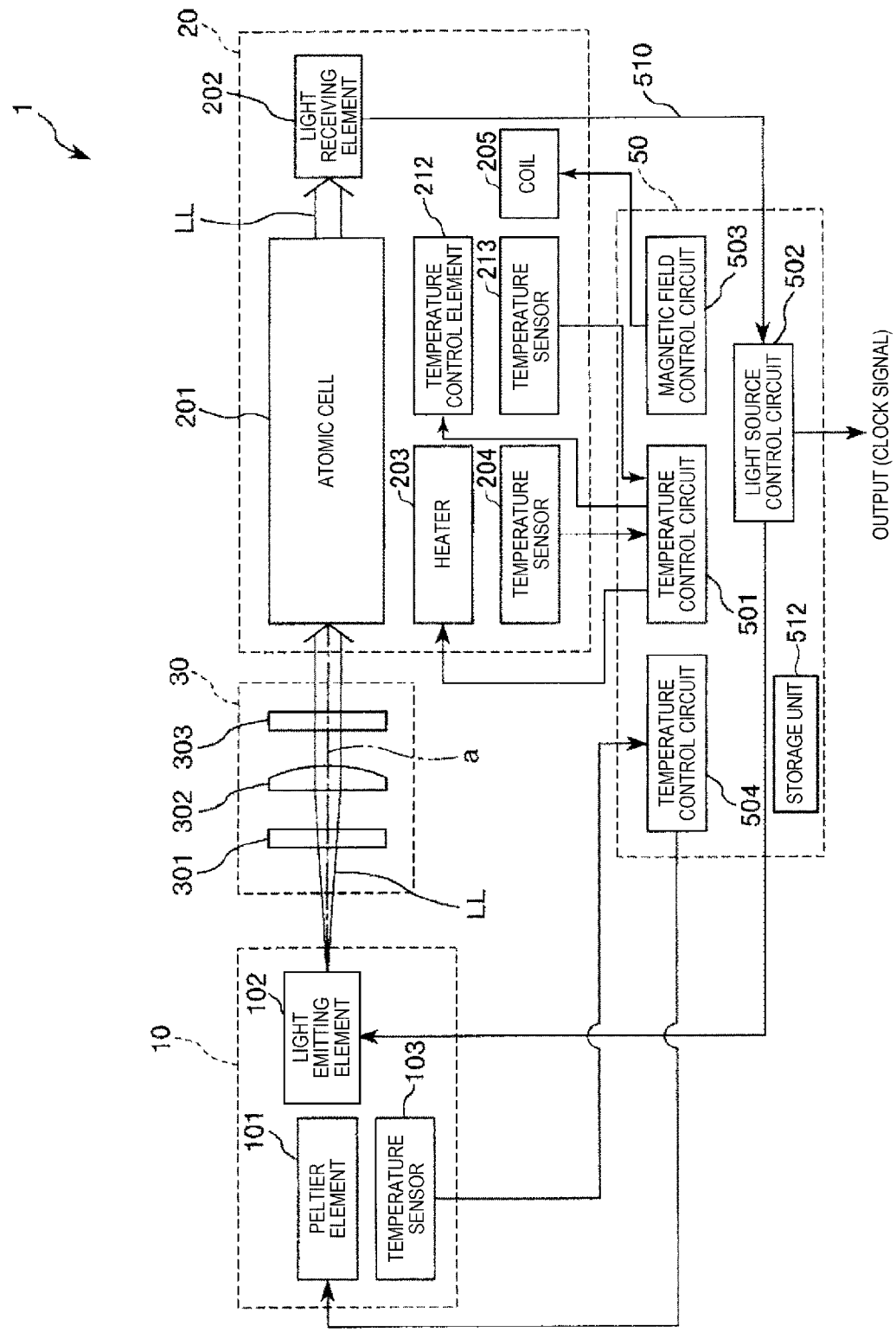
FIG. 1 is a schematic view illustrating an atomic oscillator according to a first embodiment.

FIG. 1 is a schematic diagram illustrating an atomic oscillator according to the first embodiment.

The atomic oscillator 1 illustrated in FIG. 1 is an atomic oscillator using a quantum interference effect in which a phenomenon occurs in which, when alkali metal atoms are simultaneously irradiated with two resonance lights having specific different wavelengths, the two resonance lights are transmitted without being absorbed by the alkali metal atoms. This phenomenon is also called an electromagnetically induced transparency (EIT) phenomenon.

As illustrated in FIG. 1, the atomic oscillator 1 includes a light emitting element module 10, an atom cell unit 20, an optical system unit 30 provided between the light emitting element module 10 and the atom cell unit 20, and a control circuit 50 that controls an operation of the light emitting element module 10 and the atom cell unit 20. Hereinafter, first, an outline of the atomic oscillator 1 will be described.

The light emitting element module 10 includes a Peltier element 101, a light emitting element 102, and a temperature sensor 103. The light emitting element 102 emits linearly polarized light LL including two types of light having different frequencies. The temperature sensor 103 measures temperature of the light emitting element 102. The Peltier element 101 adjusts the temperature of the light emitting element 102, that is, heats or cools the light emitting element 102.

The optical system unit 30 includes a neutral density filter 301, a condensing lens 302, and a quarter wavelength plate 303, which are arranged along an optical axis a of light LL. The neutral density filter 301 reduces intensity of the light LL from the light emitting element 102 described above. The condensing lens 302 adjusts a radiation angle of the light LL so that the light LL approaches parallel light, for example. The quarter wavelength plate 303 converts two types of light having different frequencies included in the light LL from linearly polarized light to circularly polarized light, that is, right circularly polarized light or left circularly polarized light.

The atom cell unit 20 includes an atom cell 201, a light receiving element 202, a heater 203 that is a second temperature control element, a temperature sensor 204, a coil 205, a temperature control element 212 that is a first temperature control element, and a temperature sensor 213 that is a first temperature measurement element.

The atom cell 201 is light-transmitting to the light LL, and alkali metal atoms are enclosed in the atom cell 201. The alkali metal atom has an energy level of a three-level system composed of two different ground levels and an excited level. The light LL from the light emitting element 102 is incident on the atom cell 201 via the neutral density filter 301, the condensing lens 302, and the quarter wavelength plate 303. The light receiving element 202 receives the light LL that passes through the atom cell 201 and outputs a signal corresponding to the intensity of the received light.

The heater 203 is a second temperature control element, and heats alkali metal atoms in the atom cell 201 to bring at least a part of the alkali metal atoms into gas state having a desired concentration. The coil 205 applies a magnetic field in a predetermined direction to the alkali metal atoms in the atom cell 201 to cause Zeeman splitting of the energy level of the alkali metal atoms. As such, in a state where the energy level of the alkali metal atom is subjected to Zeeman splitting, when the alkali metal atoms are irradiated with the circularly polarized resonance light pair as described above, the number of alkali metal atoms at a desired energy level among the plurality of levels obtained by being subjected to Zeeman splitting of the alkali metal atoms can be made relatively larger than the number of alkali metal atoms at other energy levels. For that reason, the number of atoms that express a desired EIT phenomenon increases, and the desired EIT signal, that is, a signal that appears in an output signal of the light receiving element 202 increases along with the EIT phenomenon, and as a result, the oscillation characteristics of the atomic oscillator 1, particularly short-term frequency stability, can be improved.

The control circuit 50 includes a temperature control circuit 501, a light source control circuit 502, a magnetic field control circuit 503, a temperature control circuit 504, and a storage 512. In this embodiment, the temperature control circuit 501 controls energization to the temperature control element 212 and the heater 203 based on the measurement result of the temperature sensor 213 so that the inside of the atom cell 201 becomes a desired temperature. The magnetic field control circuit 503 controls energization to the coil 205 so that the magnetic field generated by the coil 205 is constant. The temperature control circuit 504 controls energization to the Peltier element 101 based on the measurement result of the temperature sensor 103 so that the temperature of the light emitting element 102 becomes a desired temperature. For example, a processor such as a central processing unit (CPU) may be used as the control circuits. That is, a control operation as described later may be executed by executing a program stored in the storage 512 by the processor.

The light source control circuit 502 controls frequencies of the two types of light included in the light LL from the light emitting element 102 based on the measurement result of the light receiving element 202 so that the EIT phenomenon occurs. Here, when these two types of light become a resonance light pair having a frequency difference corresponding to an energy difference between the two ground levels of the alkali metal atoms in the atom cell 201, the EIT phenomenon occurs. The light source control circuit 502 includes a voltage controlled oscillator (VCO) (not illustrated) whose oscillation frequency is controlled so as to be stabilized in synchronization with the control of frequencies of the two types of light, and outputs the output signal of the voltage controlled oscillator as an output signal of the atomic oscillator 1, that is, a clock signal.

The outline of the atomic oscillator 1 has been described as above. Hereinafter, a more specific configuration of the atomic oscillator 1 will be described with reference to FIGS. 2 to 6.

Figure 2:
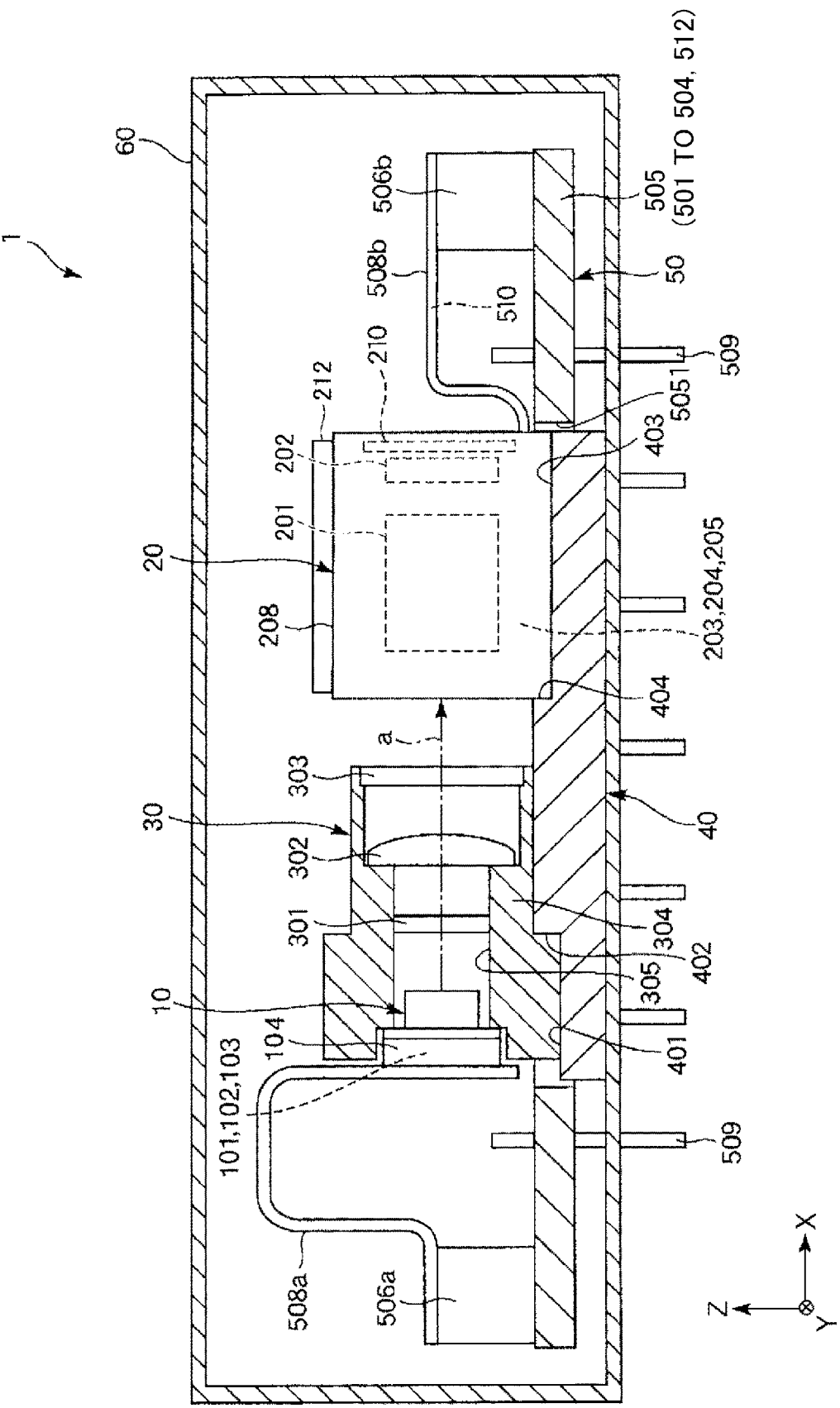
FIG. 2 is a cross-sectional side view of the atomic oscillator according to the first embodiment, that is, a cross-sectional view taken along the XZ plane.
Figure 3:
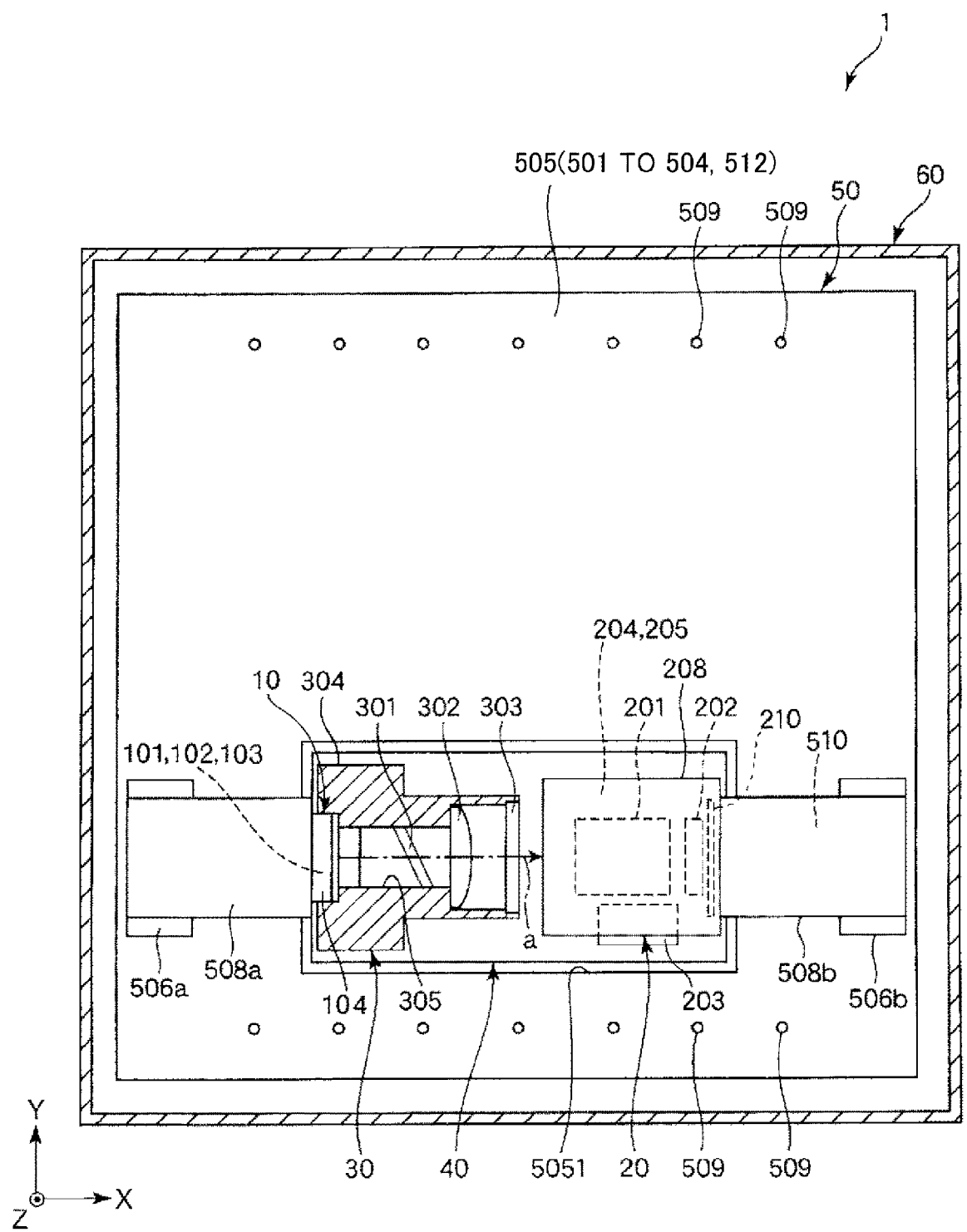
FIG. 3 is a plan view of the atomic oscillator according to the first embodiment, that is, a cross-sectional view taken along the XZ plane.
Figure 5:
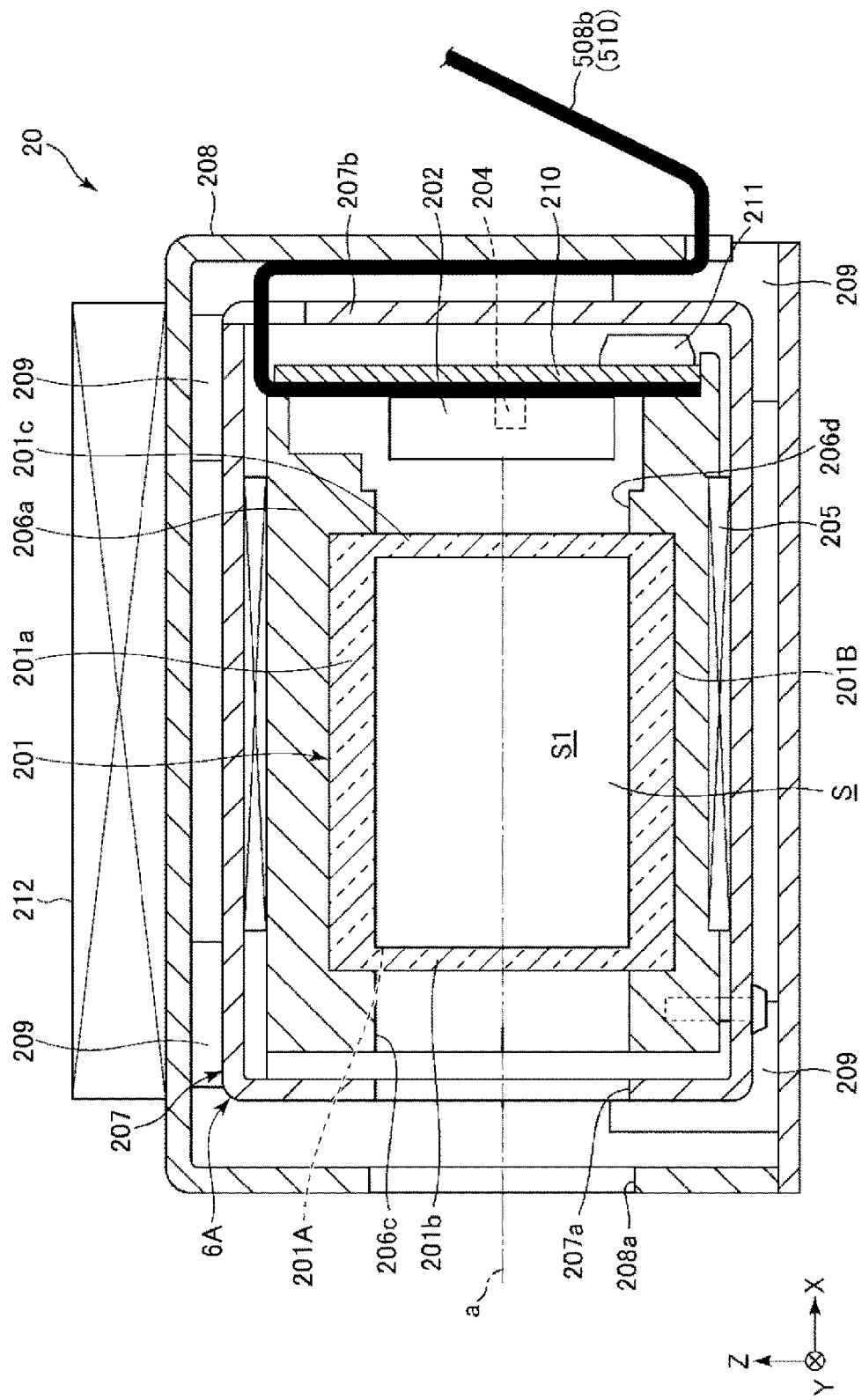
FIG. 5 is a cross-sectional view taken along the XZ plane of the atom cell unit included in the atomic oscillator according to the first embodiment.
Figure 6:
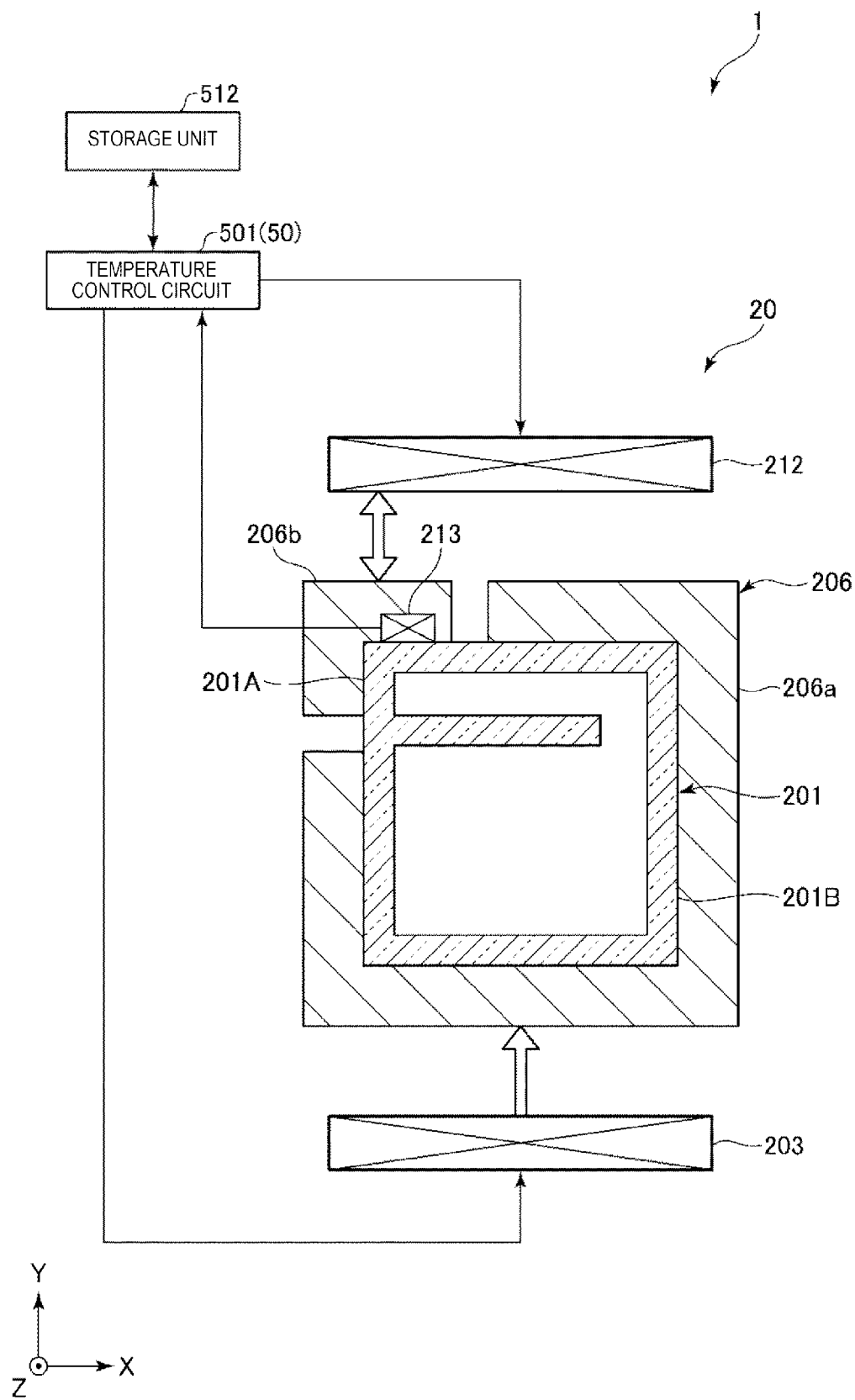
FIG. 6 is a schematic cross-sectional view taken along the XY plane of the atom cell unit provided in the atomic oscillator according to the first embodiment, and is a schematic configuration diagram illustrating thermal coupling and electrical coupling.
Figure 7:
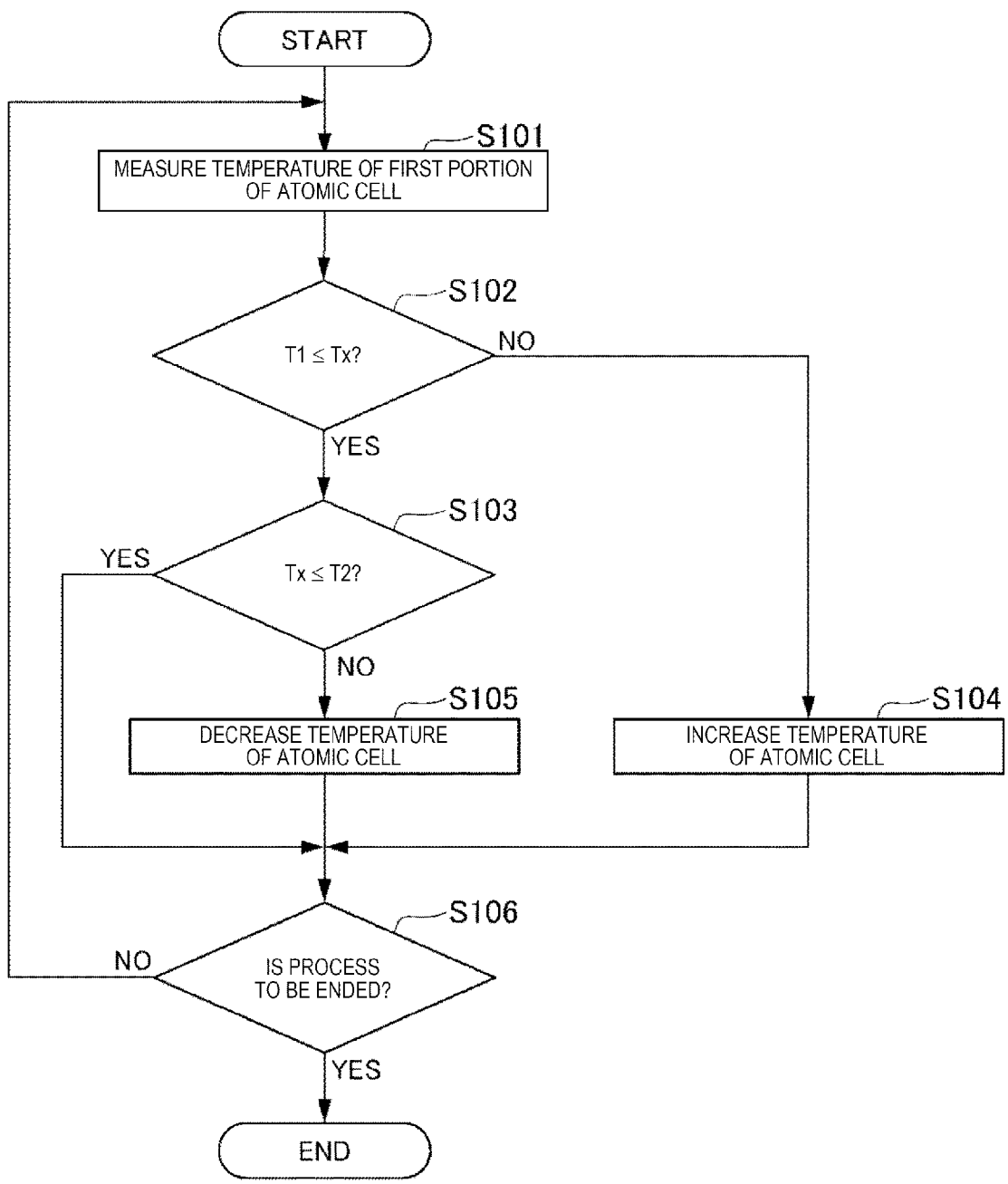
FIG. 7 is a flowchart illustrating a control operation performed by a temperature control circuit illustrated in FIG. 1.

FIG. 2 is a cross-sectional side view of the atomic oscillator according to the first embodiment, that is, a cross-sectional view taken along the XZ plane. FIG. 3 is a plan view of the atomic oscillator according to the first embodiment, that is, a cross-sectional view taken along the XZ plane. FIG. 4 is a cross-sectional view along the XY plane of the atom cell unit included in the atomic oscillator according to the first embodiment. FIG. 5 is a cross-sectional view taken along the XZ plane of the atom cell unit included in the atomic oscillator according to the first embodiment. FIG. 6 is a schematic cross-sectional view taken along the XY plane of the atom cell unit provided in the atomic oscillator according to the first embodiment, and is a schematic configuration diagram illustrating thermal coupling and electrical coupling. FIG. 7 is a flowchart illustrating a control operation performed by the temperature control circuit illustrated in FIG. 1.

Hereinafter, for convenience of explanation, description will be made by using the X-axis, the Y-axis, and the Z-axis, which are three axes orthogonal to each other. In the present specification, the Z-axis is an axis perpendicular to an installation surface 401 and an installation surface 403 of a support member 40 described later. The X-axis is an axis along the light LL emitted from the light emitting element module 10. In other words, the X-axis is an axis along an arrangement direction of the light emitting element module 10 and the atom cell unit 20. The Y-axis is an axis perpendicular to the X-axis and the Z-axis.

As illustrated in FIG. 2, the atomic oscillator 1 includes the light emitting element module 10, the atom cell unit 20, the optical system unit 30 holding the light emitting element module 10, the support member 40 that collectively supports the atom cell unit 20 and the optical system unit 30, and the control circuit 50 electrically coupled to the light emitting element module 10 and the atom cell unit 20, and a package 60 accommodating these components.

Light Emitting Element Module

The light emitting element module 10 includes the Peltier element 101, the light emitting element 102, the temperature sensor 103, and a package 104 that accommodates these components.

Although not illustrated, the package 104 includes a base and a lid bonded to each other, and an airtight space for accommodating the Peltier element 101, light emitting element 102, and temperature sensor 103 is formed between the base and the lid. Inside of such a package 104 may be in a decompressed (vacuum) state. With this configuration, the influence of the temperature change outside the package 104 on the light emitting element 102 and the temperature sensor 103 in the package 104 can be reduced, and temperature fluctuations of the light emitting element 102 and the temperature sensor 103 in the package 104 can be reduced. The inside of the package 104 may not be in a decompressed state, and inert gas such as nitrogen, helium, or argon may be enclosed therein.

Here, the base is made of, for example, an insulating ceramic material. A plurality of coupling electrodes that are electrically coupled to the Peltier element 101, the light emitting element 102, and the temperature sensor 103 are provided on the inner surface of the base, and each of these coupling electrodes is electrically coupled to an external mounting electrode provided on the outer surface of the base via through-electrodes penetrating the base. On the other hand, the lid is made of, for example, a metal material such as Kovar having a linear expansion coefficient close to that of ceramics. The lid is bonded to the base by, for example, seam welding. The lid is provided with a hole that transmits the light LL from the light emitting element 102, and the hole is hermetically closed by a light-transmitting plate-like member such as a glass material. Although not illustrated, the Peltier element 101 is fixed to the inner surface of the base of the package 104 with an adhesive.

The Peltier element 101 can switch between a state where the light emitting element 102 side is a heat generating side and a state where the light emitting element 102 side is a heat absorbing side, depending on a direction of a supplied current. For that reason, even if a range of environmental temperature is wide, the temperature of the light emitting element 102 and the like can be adjusted to a desired temperature, that is, a target temperature. With this configuration, adverse effects due to temperature change, such as the wavelength fluctuation of the light LL, can be further reduced. Here, the target temperature of the light emitting element 102 is determined according to the characteristics of the light emitting element 102 and is not particularly limited, but is, for example, about 30° C. or more and 40° C. or less. On such a Peltier element 101, the light emitting element 102 and the temperature sensor 103 are installed.

The light emitting element 102 is a semiconductor laser, for example, a vertical cavity surface emitting laser, that is, a VCSEL or the like. The semiconductor laser can emit two types of light having different wavelengths by superimposing a high-frequency signal on a DC bias current, that is, applying modulation. In this embodiment, light emitted from the light emitting element 102 is linearly polarized. The temperature sensor 103 is a temperature measurement element such as a thermistor or a thermocouple, for example.

Optical System Unit

As illustrated in FIG. 2, the optical system unit 30 includes the neutral density filter 301, the condensing lens 302, the quarter wavelength plate 303, and a holder 304 that holds these components. Here, the holder 304 has a through-hole 305 opened at both ends. The through-hole 305 is a light LL passage region, and in the through-hole 305, the neutral density filter 301, the condensing lens 302, and the quarter wavelength plate 303 are disposed side by side in this order along the optical axis a of the light LL. As illustrated in FIG. 3, the neutral density filter 301, the condensing lens 302 and the quarter wavelength plate 303 are respectively fixed to the holder 304 by an adhesive or the like (not illustrated). Such a holder 304 is made of, for example, a metal material such as aluminum and has heat dissipation.

As described above, the neutral density filter 301 has a function of reducing the intensity of the light LL from the light emitting element 102 described above. The neutral density filter 301 is not particularly limited, and may be either an absorption type or a reflection type. The condensing lens 302 has a function of adjusting the radiation angle of the light LL so that the light LL approaches parallel light, for example. With this configuration, it is possible to reduce a change in power density of the light LL in a traveling direction in the atom cell 201 and suppress the expansion of a line width of the EIT signal. As a result, it is possible to improve the oscillation characteristics of the atomic oscillator 1, particularly the short-term frequency stability. The quarter wavelength plate 303 has a function of converting two types of light having different frequencies included in the light LL from linearly polarized light into circularly polarized light, that is, right circularly polarized light or left circularly polarized light. With this configuration, the intensity of the EIT signal can be increased by the interaction with the magnetic field from the coil 205.

In the optical system unit 30, the neutral density filter 301 can be omitted depending on the intensity of the light LL from the light emitting element 102 or the like. The optical system unit 30 may include optical elements other than the neutral density filter 301, the condensing lens 302, and the quarter wavelength plate 303. The order of disposition of the neutral density filter 301, the condensing lens 302, and the quarter wavelength plate 303 is not limited to the order illustrated in the figure, and is random order. Postures of the neutral density filter 301, the condensing lens 302, and the quarter wavelength plate 303 are random postures.

Atom Cell Unit

As described above, the atom cell unit 20 includes the atom cell 201, the light receiving element 202, the heater 203, and the coil 205. In addition to these components, as illustrated in FIG. 4, the atom cell unit 20 includes a holding member 206 holding the atom cell 201, a heat transfer member 210 fixed to the holding member 206, the atom cell 201, the light receiving element 202, the coil 205, a first shield 207 accommodating the holding member 206 and the heat transfer member 210, a second shield 208 accommodating the first shield 207, a plurality of spacers 209 disposed between the first shield 207 and the second shield 208, the temperature control element 212, and a temperature sensor 213.

In the atom cell 201, gaseous alkali metals such as rubidium, cesium, and sodium are enclosed. In the atom cell 201, a rare gas such as argon or neon, or an inert gas such as nitrogen and an alkali metal gas as a buffer gas may be enclosed, if necessary.

The atom cell 201 includes a trunk body 201a having two columnar through-holes, and a pair of windows 201b and 201c bonded to the trunk body 201a, and an internal space S hermetically sealed by these components is formed.

In this embodiment, the internal space S includes a space S1 through which the light LL passes and a space S2 communicating with the space S1 and accommodating solid or liquid alkali metal (not illustrated). Here, the light LL incident on the space S1 is transmitted through one window 201b, and the light LL emitted from the space S1 is transmitted through the other window 201c. The internal space S is not limited to the form including the spaces S1 and S2 as described above, and may be a form in which the space S2 is omitted, for example.

A constituent material of each of the windows 201b and 201c only needs to have light-transmitting property to the light LL and examples thereof include glass materials and quartz crystal. On the other hand, although a constituent material of the trunk body 201a is not particularly limited and examples thereof include a metal material, a glass material, a silicon material, and a quartz crystal, from the viewpoint of workability and bonding of the windows 201b and 201c, a glass material or a silicon material may be used as the constituent material of the trunk body 201a. A bonding method between the trunk body 201a and each of the windows 201b and 201c is determined according to these constituent materials and is not particularly limited, but, for example, a direct bonding method, an anodic bonding method, a melt bonding method, an optical bonding method and the like can be used as the bonding method.

In such an atom cell 201, a portion to be cooled and covered with a block 206b described later is a first portion 201A, and a portion covered with a block 206a described later and heated is a second portion 201B. The first portion 201A and the second portion 201B may not have a clear boundary.

As illustrated in FIG. 4, the holding member 206 includes two blocks 206a and 206b provided so as to cover the outer surface of the atom cell 201 while avoiding the light LL passage region. Here, each of the two blocks 206a and 206b has a thermal conductivity of 10 W·m$^{-1}$·K$^{-1}$ or more, and is made of a material that does not inhibit the magnetic field from the coil 205 to the atom cell 201, for example, a nonmagnetic metal material such as aluminum. The holding member 206 is provided with an opening 206c through which the light LL incident on the atom cell 201 passes and an opening 206d through which the light LL emitted from the atom cell 201 passes. In the following description, matters that thermal conductivity of 10 W·m$^{-1}$·K$^{-1}$ or more may be expressed as "excellent thermal conductivity", "good thermal conductivity", or the like.

The block 206a is thermally coupled to a portion of the outer surface of the atom cell 201 on the space S1 side, that is, the second portion 201B. Specifically, the block 206a is in contact with the portion of the outer surface of the atom cell 201 on the space S1 side or coupled through a member such as metal having excellent thermal conductivity. The block 206a is thermally coupled to the heater 203 via the first shield 207. With this configuration, the atom cell 201, more specifically, the space S1 can be heated by heat from the heater 203. As such, by interposing the block 206a between the atom cell 201 and the heater 203, a distance between the atom cell 201 and the heater 203 is increased, and it is possible to suppress the unnecessary magnetic field generated by energizing the heater 203 from adversely affecting the alkali metal atoms in the atom cell 201. There is an advantage that the number of heaters can be reduced as compared with a configuration in which the heaters are in contact with the atom cell 201.

On the other hand, the block 206b is thermally coupled to a portion of the outer surface of the atom cell 201 on a space S2 side, that is, the first portion 201A. Specifically, the block 206b is in contact with the portion of the outer surface of the atom cell 201 on the space S2 side, or coupled through a member such as metal having excellent thermal conductivity. The block 206b is separated from the block 206a. For that reason, the block 206b is less likely to transfer heat from the heater 203 than the block 206a.

The constituent material of the atom cell 201 has a relatively low thermal conductivity, and heat transfer between the first portion 201A and the second portion 201B can be almost ignored. Since the block 206a and the block 206b are separated from each other, in a heat path between the first portion 201A and the temperature control element 212 and a heat path between the second portion 201B and the heater 203, heat transfer is reduced compared to the case where the block 206a and the block 206b are continuous, that is, it can be said that the two heat paths are separated from each other.

By such blocks 206a and 206b, the atom cell 201 has two portions having different temperatures. That is, the first portion 201A covered with the block 206b is cooled to a relatively low temperature, and the second portion 201B covered with the block 206a is heated to a higher temperature than the first portion 201A. Thus, the alkali metal atoms exist as gas in the space S1, and the alkali metal atoms are attached to the inner wall of the atom cell 201 as liquid or solid in the space S2.

A shape of the blocks 206a and 206b is not limited to the shape illustrated in the figure as long as heat from the heater 203 can be transferred to the space S1 while allowing the light LL to pass through the space S1. The holding member 206 may be integrated if there is a portion having relatively large thermal resistance between the blocks 206a and 206b, or each of the blocks 206a and 206b may be constituted with a plurality of members.

On the outer periphery of the holding member 206, the coil 205 wound so that the central axis is along the optical axis a of the light LL is disposed. The coil 205 is a solenoid-type coil or a pair of Helmholtz-type coils. The coil 205 generates a magnetic field in the atom cell 201 in a direction along the optical axis a of the light LL, that is, in a parallel direction. With this configuration, gaps between different energy levels in which the alkali metal atoms in the atom cell 201 are degenerated can be widened by Zeeman splitting to improve resolution and reduce the line width of the EIT signal. The magnetic field generated by the coil 205 may be either a DC magnetic field or an AC magnetic field, or may be a magnetic field in which a DC magnetic field and an AC magnetic field are superimposed.

The light receiving element 202 is disposed in the opening 206d of the holding member 206. The light receiving element 202 is not particularly limited as long as it can detect the light LL transmitted through the atom cell 201, that is, the intensity of the resonance light pair, but, a photodetector that is a light receiving element such as a photodiode is included. The temperature sensor 204 is not particularly limited as long as it can measure the temperature of the atom cell 201 or the heater 203, but various known temperature sensors such as a thermistor and a thermocouple are included.

Here, the light receiving element 202 and the temperature sensor 204 are disposed on a flexible wiring board 508b described later. The flexible wiring board 508b includes a wiring 510 that is electrically coupled to the light receiving element 202 and the temperature sensor 204, and is fixed to the holding member 206 by being sandwiched between the holding member 206 and the heat transfer member 210. With this configuration, the light receiving element 202 and the temperature sensor 204 can be positioned with respect to the atom cell 201.

The heat transfer member 210 has thermal conductivity and is thermally coupled to the holding member 206 and the flexible wiring board 508b. The heat transfer member 210 is also thermally coupled to the heater 203 via the holding member 206. With this configuration, the heat transfer member 210 can conduct heat from the holding member 206 to the flexible wiring board 508b and the light receiving element 202. In this embodiment, as illustrated in FIGS. 4 and 5, the heat transfer member 210 has a plate shape and is disposed along the YZ plane, and is fixed to the block 206a of the holding member 206 by screwing using a screw 211.

As illustrated in FIGS. 4 and 5, the heat transfer member 210 is provided so as to cover the opening 206d of the holding member 206 as much as possible. With this configuration, the heat transfer member 210 can conduct heat integrally with the holding member 206. The heat transfer member 210 overlaps the light receiving element 202 and the temperature sensor 204 when viewed from the direction of the optical axis a. With this configuration, heat from the heat transfer member 210 is easily conducted to the light receiving element 202 and the temperature sensor 204.

As a constituent material of such a heat transfer member 210, a material that has excellent thermal conductivity and does not inhibit the magnetic field from the coil 205 to the atom cell 201, for example, a nonmagnetic metal material such as copper or aluminum, carbon fiber reinforced plastic (CFRP), and a resin material to which a thermally conductive filler such as silica is added, is included.

The thermal conductivity of the constituent material of the heat transfer member 210 is preferably 10 $W·m^{-1}·K^{-1}$ or more, more preferably 20 $W·m^{-1}·K^{-1}$ or more, and particularly preferably 100 $W·m^{-1}·K^{-1}$ or more. With this configuration, the vicinity of the light receiving element 202 of the wiring 510 can be suitably heated by the heat transfer member 210. In contrast, if the thermal conductivity is too small, a temperature gradient tends to occur in the heat transfer member 210.

The atom cell 201, the light receiving element 202, the temperature sensor 204, the coil 205, the holding member 206, and the heat transfer member 210 as described above are accommodated in the first shield 207 as a shield as illustrated in FIG. 4. The first shield 207 supports the atom cell 201 via the holding member 206, and is thermally coupled to the atom cell 201 via the holding member 206 by this support. The first shield 207 is provided with an opening 207a that allows passage of the light LL incident on the space S1 of the atom cell 201. The first shield 207 has a portion 207b facing the heat transfer member 210 described above in state of being separated. The first shield 207 may be in contact with the heat transfer member 210.

Here, as the constituent material of the first shield 207, a material having excellent thermal conductivity and a magnetic shielding property may be used, specifically, iron, iron-based alloys such as Kovar, Permalloy, stainless steel, and the like may be used. Since the first shield 207 has excellent thermal conductivity, heat from the heater 203 can be efficiently conducted to the holding member 206. A temperature distribution of the first shield 207 can be made uniform, and the temperature gradient around the atom cell 201 can be reduced. Furthermore, since the first shield 207 has a magnetic shielding property, the fluctuation of the magnetic field in the first shield 207, particularly in the atom cell 201, due to an external magnetic field can be reduced.

Such a first shield 207 is accommodated in the second shield 208 as illustrated in FIG. 4. The second shield 208 supports the first shield 207 via a plurality of spacers 209, thereby being separated from the first shield 207. Therefore, a gap is formed between the first shield 207 and the second shield 208 and the gap functions as a heat insulating layer, and thus movement of heat between the first shield 207 and the second shield 208 can be reduced. Here, each spacer 209 may be made of a heat insulating material, for example, a resin material such as a polyimide resin or an acrylic resin. With this configuration, the movement of heat between the first shield 207 and the second shield 208 via the spacer 209 can be reduced. The second shield 208 is provided with an opening 208a that allows passage of the light LL incident on the space S1 of the atom cell 201.

Here, as the constituent material of the second shield 208, a material having excellent thermal conductivity and a magnetic shielding property may be used similar to the first shield 207 described above, specifically, iron, iron-based alloys such as Kovar, permalloy, and stainless steel, and the like may be used. With this configuration, the fluctuation of the magnetic field in the second shield 208, particularly in the atom cell 201, due to the external magnetic field can be reduced.

Also, the second shield 208 is provided with the heater 203 thermally coupled to the first shield 207. In the illustrated configuration, the heater 203 is embedded in the second shield 208 so as to contact the first shield 207. The heater 203 is not particularly limited as long as it can heat the atom cell 201, more specifically, alkali metal atoms in the atom cell 201, but various heaters having a heating resistor, the Peltier element, and the like are included.

The temperature control element 212 is installed on the outer surface of the second shield 208 on the +Z side. The temperature control element 212 has a function of controlling the temperature of the atom cell 201 by performing cooling and heating, and can be constituted with the Peltier element or the like, for example. The temperature control element 212 is thermally coupled to the atom cell 201 via the wall portion of the second shield 208 on the +Z-axis side and the spacer 209.

As illustrated in FIG. 4, the temperature sensor 213 is installed inside the first shield 207 and in the vicinity of the block 206b. The temperature sensor 213 measures the temperature of the first portion 201A. Based on the measurement result, the temperature control circuit 501 controls the operation of the temperature control element 212. The temperature sensor 213 is not particularly limited as long as it can measure the temperature of the block 206b, but various known temperature sensors such as a thermistor and a thermocouple are included.

Support Member

Here, when referring back to FIG. 2, the support member 40 has a plate shape, and the atom cell unit 20 and optical system unit 30 described above are placed on one surface thereof. The support member 40 has an installation surface 401 along the shape of the lower surface of the holder 304 of the optical system unit 30. A step 402 is formed on the installation surface 401. The step 402 engages with a step on the lower surface of the holder 304, and restricts the holder 304 from moving to the atom cell unit 20 side, that is, the right side in FIG. 2. Similarly, the support member 40 has an installation surface 403 along the shape of the lower surface of the second shield 208 of the atom cell unit 20. A step 404 is formed on the installation surface 403. The step 404 engages with the end surface of the second shield 208, that is, the left end surface in FIG. 2, and restricts the second shield 208 from moving to the optical system unit 30 side, that is, the left side in FIG. 2.

As such, a relative positional relationship between the atom cell unit 20 and the optical system unit 30 can be prescribed by the support member 40. Since the light emitting element module 10 is fixed to the holder 304, the relative positional relationship of the light emitting element module 10 with respect to the atom cell unit 20 and the optical system unit 30 is also prescribed. Here, each of the second shield 208 and the holder 304 is fixed to the support member 40 by a fixing member such as a screw (not illustrated). The support member 40 is fixed to the package 60 by a fixing member such as a screw (not illustrated). The support member 40 is made of, for example, a metal material such as aluminum and has heat dissipation properties. With this configuration, heat dissipation of the light emitting element module 10 can be efficiently performed.

Control Circuit

As illustrated in FIG. 3, the control circuit 50 includes a circuit board 505, two connectors 506a and 506b provided on the circuit board 505, and a flexible wiring board 508a coupling the connector 506a and the light emitting element module 10, a flexible wiring board 508b coupling the connector 506b and the atom cell unit 20, and a plurality of lead pins 509 penetrating the circuit board 505.

Here, an electric circuit (not illustrated) is provided on the circuit board 505, and this electric circuit functions as the temperature control circuit 501, light source control circuit 502, magnetic field control circuit 503, and temperature control circuit 504 described above. The circuit board 505 has a through-hole 5051 through which the support member 40 described above is inserted. The circuit board 505 is supported with respect to the package 60 via the plurality of lead pins 509. Each of the plurality of lead pins 509 penetrates the inside and outside of the package 60 and is electrically coupled to the circuit board 505.

A configuration in which the circuit board 505 and the light emitting element module 10 are electrically coupled and a configuration in which the circuit board 505 and the atom cell unit 20 are electrically coupled are not limited to the illustrated connectors 506a and 506b and the flexible wiring boards 508a and 508b, and those configurations may be other known connectors and wirings, respectively.

The circuit board 505 is provided with a storage 512. The storage 512 stores, for example, a calibration curve described later and various programs.

Similar to the first shield 207 and the second shield 208 described above, the package 60 may be made of a metal material having a magnetic shielding property such as Kovar. With this configuration, it is possible to reduce the external magnetic field from adversely affecting the characteristics of the atomic oscillator 1. The inside of the package 60 may be decompressed or atmospheric pressure, but may be an airtight space.

As described above, alkali metal atoms are contained as liquid or solid in the first portion 201A of the atom cell 201, that is, in the space S2, and the alkali metal atoms are contained as gas in the second portion 201B of the atom cell 201, that is, in the space S1. By keeping a vapor pressure of the gas in the space S1 through which the light LL passes as constant as possible, frequency stability of the atomic oscillator 1 can be increased.

The first portion 201A of the atom cell 201 is more susceptible to the temperature of the external environment of the atomic oscillator 1 than the second portion 201B. This is because, as illustrated in FIG. 4, the thermal resistance between the block 206b and the block 206a is large, so that heat of the heater 203 is not easily transferred to the first portion 201A. Considering that the atom cell 201 is locally cooled to selectively contain the surplus of alkali metal atoms as liquid or solid in a portion where the light LL does not pass, such a configuration is obtained.

Such a structure is effective for selectively containing a surplus of alkali metal atoms as liquid or solid in a portion where the light LL does not pass by locally lowering the temperature of the atom cell 201. However, when the temperature of the first portion 201A of the atom cell 201 fluctuates due to a temperature change in the external environment, the amount of liquid or solid alkali metal atoms may fluctuate. Due to this fluctuation, the amount of gas of alkali metal atoms in the space S1 also fluctuates, and as a result, the vapor pressure in the space S1 may change.

On the other hand, as in the past, when the temperature measurement element and the temperature control element are provided in the portion to be heated and the portion to be cooled, respectively, and the control of feeding back the measurement result of the temperature measurement element to the temperature control element is performed at two locations, the smaller the atom cell size, the more likely the phenomenon that the feedback controls interfere with each other occurs. For that reason, the temperature of the atom cell is not stabilized, the vapor pressure of the gas fluctuates, and the frequency stability of the atomic oscillator is deteriorated.

The atomic oscillator 1 has an effective configuration to solve the problems described above. Hereinafter, this configuration will be described with reference to FIG. 6. In FIG. 6, a thin arrow means an electrical coupling, and a thick white arrow means a thermal coupling. As illustrated in FIG. 6, in the atomic oscillator 1 of this embodiment, a configuration in which the measurement result of the temperature sensor 213 that measures the temperature of the first portion 201A is transmitted to the temperature control circuit 501 and the temperature control circuit 501 controls the operation of the temperature control element 212 and the heater 203 based on the measurement result is adopted. That is, the temperature control circuit 501 adjusts both the temperature of the first portion 201A and the temperature of the second portion 201B based on the temperature of the first portion 201A that is measured by one temperature sensor 213 and is a relatively low temperature. With this configuration, interference between the two feedback controls described above can be prevented. Therefore, the frequency stability of the atomic oscillator 1 can be improved.

In particular, the atom cell 201 is a hexahedron having a side length of 1 mm or more and 15 mm or less, and is relatively small, and thus, control based on the temperature measured by one temperature sensor 213 is effective. The atomic oscillator 1 has a configuration in which the temperature of the atom cell 201 is adjusted based on the temperature of the first portion 201A, and thus the saturated vapor pressure of the first portion 201A can be adjusted more directly compared with the configuration in which the temperature of the atom cell 201 is adjusted based on the temperature of the second portion 201B. Accordingly, the vapor pressure of the gas in the space S1 can be adjusted with higher accuracy.

Next, a control operation of the temperature control circuit 501 will be described using the flowchart illustrated in FIG. 7. Hereinafter, the description starts from a state in which the atomic oscillator 1 is driven, that is, a state in which the temperature control element 212 and the heater 203 are operated. When the temperature control element 212 and the heater 203 are operated from the initial state, the temperature control element 212 and the heater 203 are operated under predetermined energization conditions so that the atom cell 201 reaches a target temperature. The energization conditions are stored in the storage 512 in advance.

First, in step S101, the temperature sensor 213 measures the temperature.

Next, it is determined whether or not a measured temperature Tx is within a desired temperature range of T1 or more to T2 or less. That is, in step S102, it is determined whether T1≤Tx, and in step S103, it is determined whether Tx≤T2. T1 and T2 are values stored in the storage 512 in advance. Instead of step S102 and step S103, it may be determined whether or not the temperature Tx is a predetermined temperature, and when it is determined that the temperature Tx is not the predetermined temperature, control to bring the temperature close to the predetermined temperature may be performed.

When it is determined in step S102 that it is T1≤Tx, the process proceeds to step S103 corresponding to the determination result of YES. When it is determined in step S102 that it is not T1≤Tx, that is, T1>Tx, the process proceeds to step S104 corresponding to the determination result of NO, and control is performed to increase the temperature of the first portion 201A of the atom cell 201 in step S104. Specifically, the control signals to the temperature control element 212 and the heater 203 are changed and input to change the energization condition to the temperature control element 212 and the energization condition to the heater 203.

The control signal to the temperature control element 212 is determined based on a calibration curve K1 indicating the relationship between the temperature Tx that is a measurement result and the control signal of the temperature control element 212, and is input to the temperature control element 212. On the other hand, the control signal of the heater 203 is determined based on a calibration curve K2 indicating the relationship between the temperature Tx that is a measurement result and the control signal of the heater 203 that is the second temperature control element, and is input to the heater 203. With this configuration, even when the temperature of the external environment changes, the desired temperature distribution of the atom cell 201 can be maintained. That is, the first portion 201A and the second portion 201B can be maintained at desired temperatures, respectively. In this case, in this embodiment, since the temperature control element 212 and the heater 203 are controlled by one control circuit, that is, the temperature control circuit 501, interference between feedback controls as in the past can be prevented.

The calibration curves K1 and K2 are tables or relational expressions stored in the storage 512 in advance, and these tables or relational expressions can be values obtained experimentally, for example.

On the other hand, when it is determined in step S103 that it is Tx≤T2, the process proceeds to step S106 described later. When it is determined in step S103 that it is not Tx≤T2, that is, Tx>T2, control is performed to decrease the temperature of the first portion 201A of the atom cell 201 in step S105. Specifically, the control signals to the temperature control element 212 and the heater 203 are changed and input to change the energization condition to the temperature control element 212 and the energization condition to the heater 203.

The control signal to the temperature control element 212 is determined based on the calibration curve K1 and input to the temperature control element 212 similarly to step S104. The control signal for the heater 203 is determined based on the calibration curve K2 and input to the heater 203 similarly to step S104. With this configuration, the desired temperature distribution of the atom cell 201 can be maintained though the temperature of the external environment is increased. That is, the first portion 201A and the second portion 201B can be maintained at desired temperatures, respectively. Also in step S105, since the temperature control element 212 and the heater 203 are controlled by one control circuit, that is, the temperature control circuit 501 similarly to step S104, the interference between feedback controls as in the past can be prevented.

Then, in step S106, it is determined whether or not there is an end instruction. This determination is made based on, for example, whether or not a power supply (not illustrated) is turned off. When it is determined in step S106 that there is no end instruction, the process returns to step S101, and step S101 and subsequent steps are sequentially repeated.

As described above, the atomic oscillator 1 includes the atom cell 201 that includes the first portion 201A and the second portion 201B at a position different from the first portion 201A and contains alkali metal atoms, the light emitting element 102 that emits light LL for exciting the alkali metal atoms toward the atom cell 201, the temperature sensor 213 that is a first temperature measurement element for measuring the temperature of the first portion 201A, the temperature control element 212 that is a first temperature control element for controlling the temperature of the first portion 201A based on the measurement result of the temperature sensor 213, the second temperature measurement element that is disposed in a portion having thermal resistance equal to or higher than the thermal resistance between the first portion 201A and the second portion 201B and measures the temperature of the portion, the heater 203 that is a second temperature control element that controls the temperature of the second portion 201B to be higher than the temperature of the first portion 201A based on the measurement result of the second temperature measurement element or information on temperature control performed by the temperature control element 212, that is, in this embodiment, based on the measurement result of the second temperature measurement element, and the light receiving element 202 that receives the light LL transmitted through the atom cell 201. In this embodiment, the second temperature control element is the temperature control element 212 as the first temperature control element. That is, the first temperature control element 212 also serves as the second temperature control element. With this configuration, one temperature control circuit 501 adjusts both the temperature of the first portion 201A and the temperature of the second portion 201B based on the temperature of the first portion 201A, that is relatively low. Therefore, it is possible to prevent interference between the two feedback controls that may have occurred in the past. Therefore, the frequency stability of the atomic oscillator 1 can be improved.

As described above, the first portion 201A and the second portion 201B are thermally separated. That is, the heat path between the first portion 201A and the temperature control element 212 and the heat path between the second portion 201B and the heater 203 are separated by the block 206a and the block 206b. By controlling each of these two thermally separated locations, mutual temperature control can be performed more accurately.

When the temperature control circuit 501 is an analog circuit, the control operation described above can be realized by using circuit elements having characteristics corresponding to the calibration curves K1 and K2. The steps illustrated in FIG. 7 do not have to be in this order, and the order of at least some of the steps may be changed or may be simultaneously performed.

Second Embodiment

Figure 8:
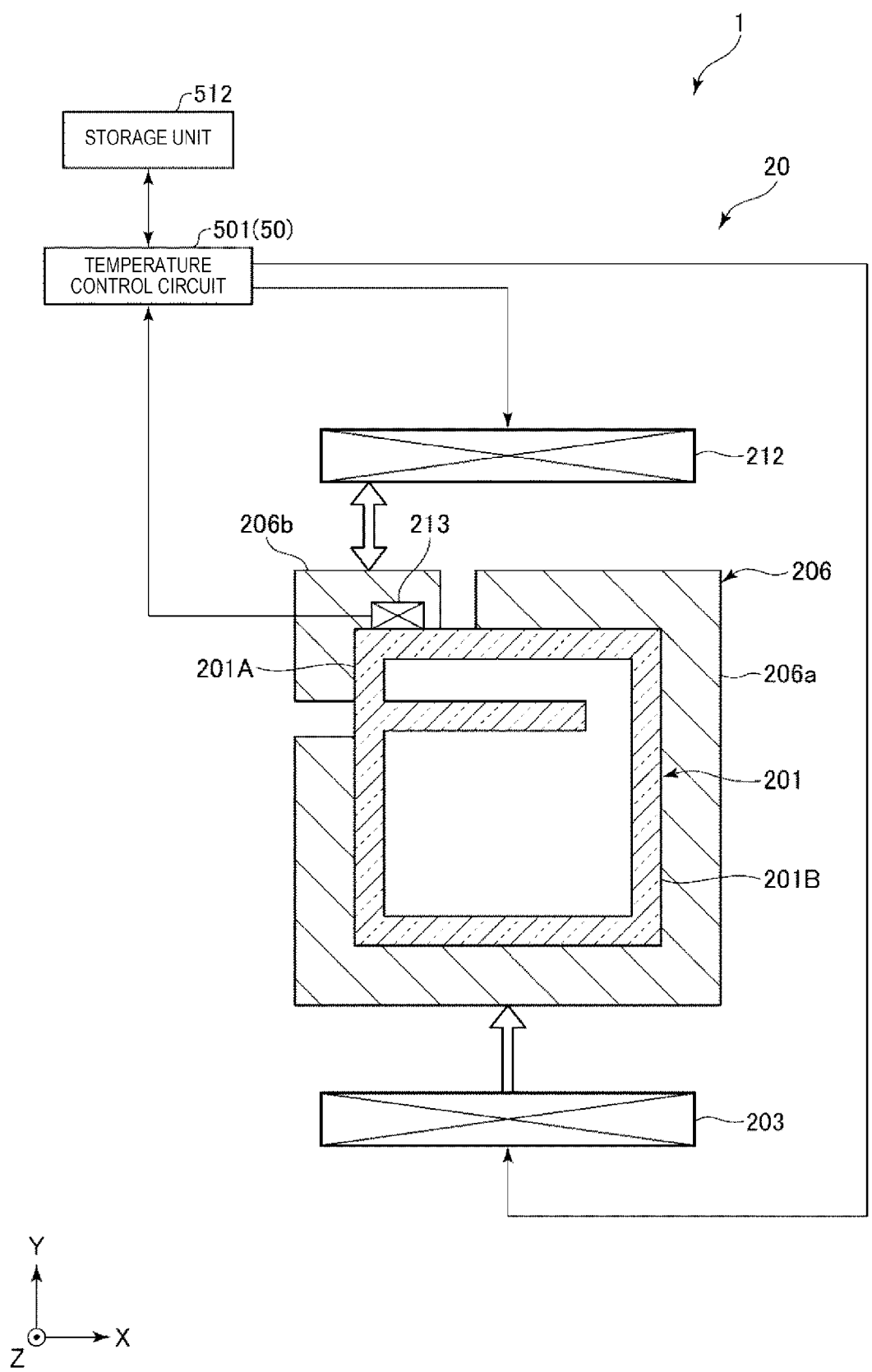
FIG. 8 is a schematic cross-sectional view taken along the XY plane of an atom cell unit provided in an atomic oscillator according to a second embodiment, and is a schematic configuration diagram illustrating thermal coupling and electrical coupling.

FIG. 8 is a schematic cross-sectional view taken along the XY plane of the atom cell unit provided in the atomic oscillator according to a second embodiment, and is a schematic configuration diagram illustrating thermal coupling and electrical coupling.

The second embodiment is the same as the first embodiment described above except that the control operation of the controller is different. In the following description, the second embodiment will be described with a focus on the differences from the first embodiment described above, and description of similar matters will be omitted.

As illustrated in FIG. 8, in the second embodiment, a configuration, in which the energization condition control signal transmitted from the temperature control circuit 501 to the heater 203 is determined based on the energization condition control signal transmitted from the temperature control circuit 501 to the temperature control element 212, is adopted. Specifically, a control signal determined based on a calibration curve K3 indicating the relationship between the energization condition transmitted to the temperature control element 212 and the energization condition transmitted to the heater 203 is transmitted to the heater 203. The calibration curve K3 is a table or a relational expression stored in the storage 512 in advance, and the table or relational expression can be a value obtained experimentally, for example. In the second embodiment, such control is performed in step S104 and step S105 described in the first embodiment.

As described above, in the second embodiment, the control signal determined based on the calibration curve indicating the relationship between the information on temperature control performed by the temperature control element 212 that is the first temperature control element and the control signal for the heater 203 that is the second temperature control element is input to the temperature control element 212 that is the second temperature control element. In other words, when the energization condition for the temperature control element 212 is determined, the energization condition for the heater 203 is also determined. With this configuration, the same effects as those of the first embodiment can be obtained with simple control.

Third Embodiment

Figure 9:
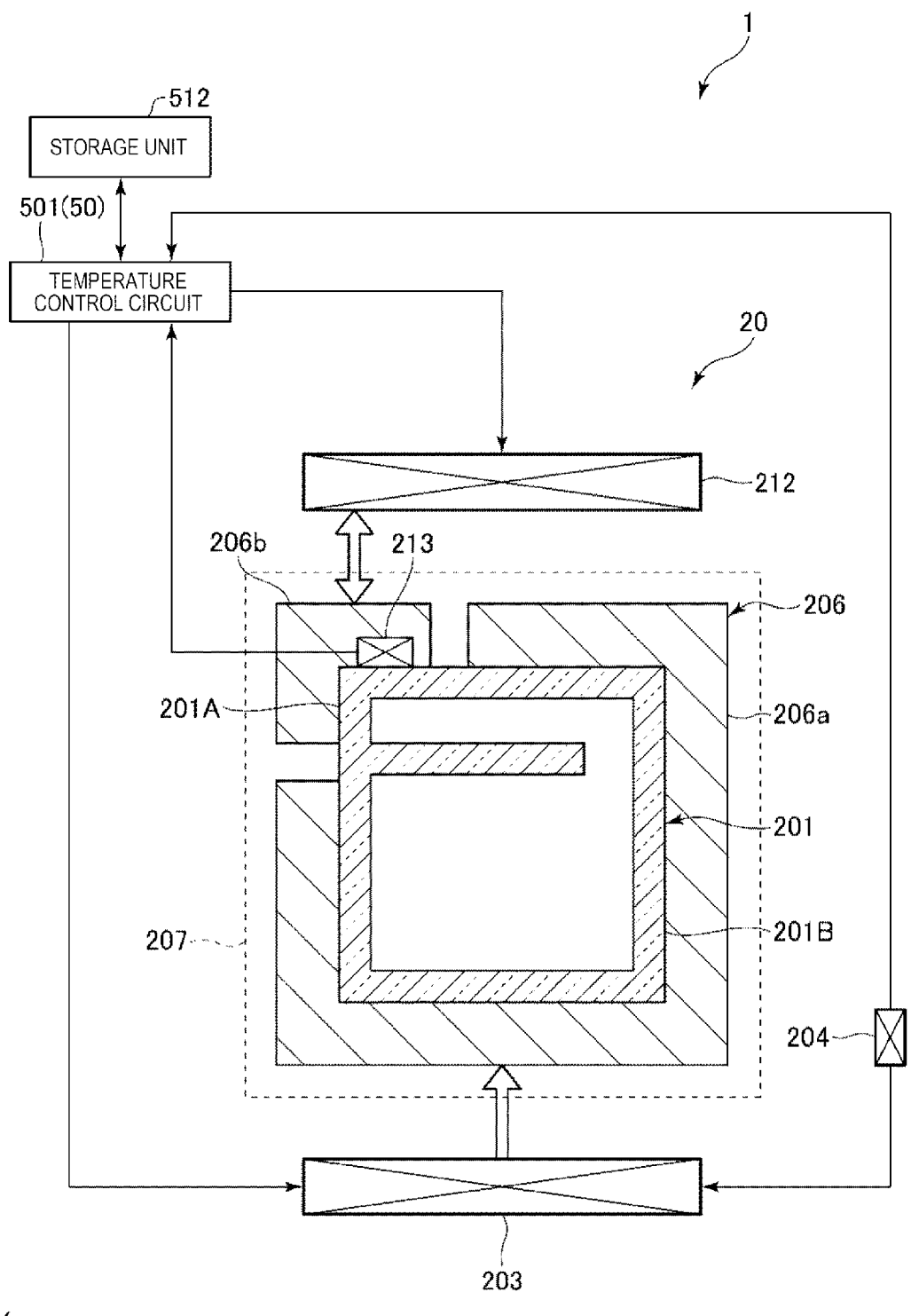
FIG. 9 is a schematic cross-sectional view taken along the XY plane of an atom cell unit provided in an atomic oscillator according to a third embodiment, and is a schematic configuration diagram illustrating thermal coupling and electrical coupling.

FIG. 9 is a schematic cross-sectional view taken along the XY plane of the atom cell unit provided in the atomic oscillator according to the third embodiment, and is a schematic configuration diagram illustrating thermal coupling and electrical coupling.

The third embodiment is the same as the first embodiment described above except that the control operation of the controller is different. In the following description, the third embodiment will be described with a focus on the differences from the first embodiment described above, and description of similar matters will be omitted.

As illustrated in FIG. 9, in the third embodiment, the atomic oscillator 1 includes a temperature sensor 204 that is a second temperature measurement element disposed outside the first shield 207. The temperature sensor 204 can have the same configuration as the temperature sensor 213. The measurement result of the temperature sensor 204 is transmitted to the temperature control circuit 501.

It can be said that the temperature sensor 204 is disposed outside the first shield 207 and is disposed in a portion having thermal resistance equal to or higher than the thermal resistance between the first portion 201A and the second portion 201B. Since the temperature measured by the temperature sensor 204 is a temperature of a portion outside the first shield 207 and in the vicinity of the second portion 201B and the heater 203 is in contact with the first shield 207, this measurement result can be regarded as the temperature of the second portion 201B. As such, the temperature sensor 213 that is the first temperature measurement element is disposed inside the first shield 207, and the temperature sensor 204 that is the second temperature measurement element is disposed outside the first shield 207. With this configuration, the temperature sensors 213 and 204 can be sufficiently thermally separated from each other, and interference between the two feedback controls that may have occurred in the past can be reduced.

In the third embodiment, the following control is performed in step S104 and step S105 described in the first embodiment.

The temperature control circuit 501, based on the measurement result of the temperature sensor 213, determines energization conditions to be transmitted to the temperature control element 212 based on the calibration curve K4 indicating the relationship between the energization conditions, and transmits a control signal to the temperature control element 212. Furthermore, the temperature control circuit 501 determines, based on the measurement result of the temperature sensor 204, energization conditions to be transmitted to the heater 203 based on the calibration curve K5 indicating these relationship between the energization conditions, and transmits a control signal to the heater 203. The calibration curves K4 and K5 are tables or relational expressions stored in advance in the storage 512, and these tables or relational expressions can be values obtained experimentally, for example.

Here, as described above, since the temperature sensor 204 is disposed in the portion having thermal resistance equal to or higher than the thermal resistance between the first portion 201A and the second portion 201B, the temperature of the portion measured by the temperature sensor 204 is less affected by the temperature change of the first portion 201A than when the temperature sensor 204 is directly coupled to the second portion 201B, for example. For that reason, interference between the two feedback controls that may have occurred in the past can be reduced. Therefore, the frequency stability of the atomic oscillator 1 can be improved.

Fourth Embodiment

Figure 10:
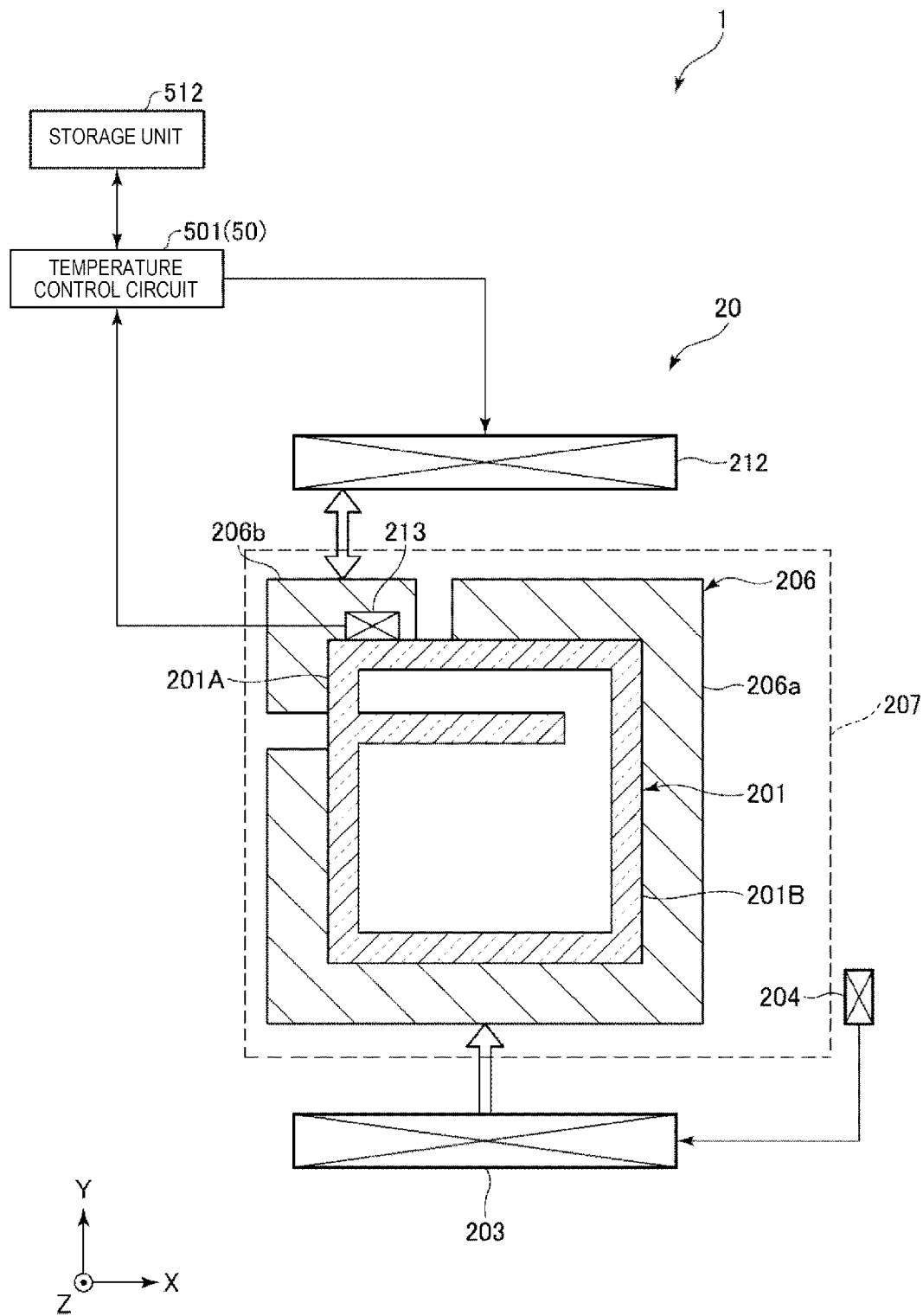
FIG. 10 is a schematic cross-sectional view taken along the XY plane of an atom cell unit provided in an atomic oscillator according to a fourth embodiment, and is a schematic configuration diagram illustrating thermal coupling and electrical coupling.

FIG. 10 is a schematic cross-sectional view taken along the XY plane of the atom cell unit provided in the atomic oscillator according to the fourth embodiment, and is a schematic configuration diagram illustrating thermal coupling and electrical coupling.

The fourth embodiment is the same as the first embodiment described above except that the control operation of the controller is different. In the following description, the fourth embodiment will be described with a focus on the differences from the first embodiment described above, and description of similar matters will be omitted.

As illustrated in FIG. 10, in the fourth embodiment, the temperature control circuit 501 transmits a control signal for the energization condition only to the temperature control element 212. On the other hand, the heater 203 operates under a constant energization condition. That is, the heater 203 is configured to perform heating at a predetermined output value, and is responsible for auxiliary heating. In the fourth embodiment, the following control is performed in step S104 and step S105 described in the first embodiment. The temperature control circuit 501 determines, based on the measurement result of the temperature sensor 213, energization conditions to be transmitted to the temperature control element 212 based on the calibration curve K6 indicating the relationship between the energization conditions, and transmits a control signal to the temperature control element 212. The calibration curve K6 is a table or relational expression stored in advance in the storage 512, and the table or relational expression can be a value obtained experimentally, for example. Even during the feedback control to the temperature control element 212, the heater 203 continues to operate under a constant energization condition.

As such, in the fourth embodiment, the atomic oscillator 1 includes the atom cell 201 that includes the first portion 201A and the second portion 201B at a position different from the first portion 201A, and contains alkali metal atoms, the light emitting element 102 that emits light LL for exciting the alkali metal atoms toward the atom cell 201, the temperature sensor 213 that is a first temperature measurement element that measures the temperature of the first portion 201A, the temperature control element 212 as a first temperature control element for controlling the temperature of the first portion 201A based on the measurement result of the temperature sensor 213, the heater 203 as a second temperature control element for controlling the second portion 201B to a temperature higher than the temperature of the first portion 201A with a predetermined output value, and the light receiving element 202 that receives the light LL transmitted through the atom cell 201. With this configuration, one temperature control circuit 501 adjusts the temperature of the first portion 201A based on the temperature of the first portion 201A having a relatively low temperature. Since the heater 203 is configured to heat the atom cell 201 with a predetermined output value, the first portion 201A and the second portion 201B can be maintained at desired temperatures, respectively, by adjusting the temperature of the first portion 201A in consideration of heating of the heater 203. Furthermore, in the fourth embodiment, since the temperature control element 212 is controlled by one control circuit, that is, the temperature control circuit 501, interference between feedback controls as in the past can be prevented. Therefore, the frequency stability of the atomic oscillator 1 can be improved.

The determination of the initial output value of the heater 203 may be a predetermined value, may be determined according to the measurement result of the temperature sensor 204, or may be determined according to the measurement result of the temperature sensor 213. In the fourth embodiment, a configuration in which the feedback control is not performed on the heater 203 is adopted, but the determination and output of the initial output value may be performed by the temperature control circuit 501, or by another control circuit (not illustrated).

Application Example of Atomic Oscillator

The atomic oscillator 1 as described above can be incorporated into various frequency signal generation systems. Hereinafter, an embodiment of such a frequency signal generation system will be described.

Figure 11:
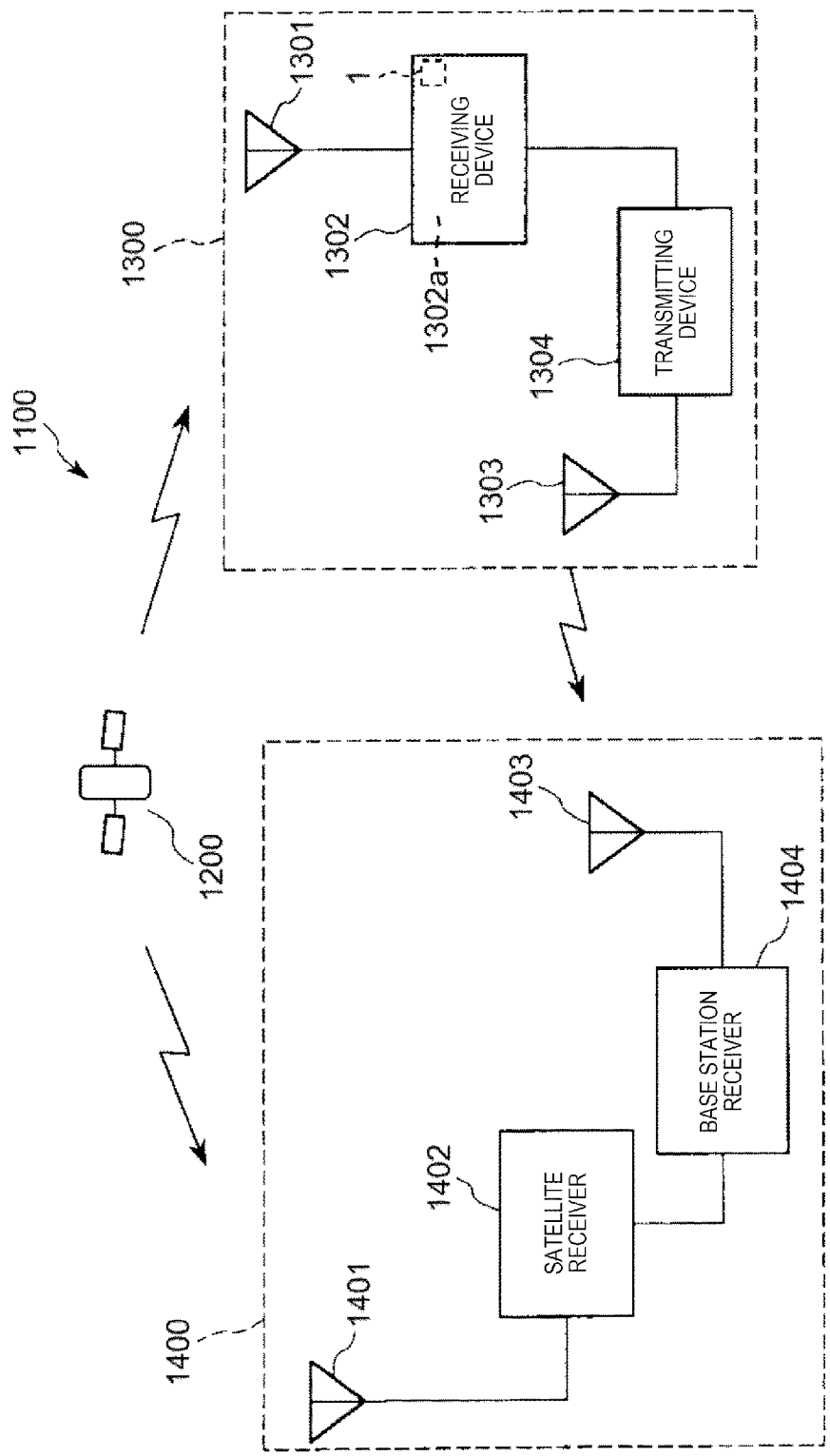
FIG. 11 is a diagram illustrating a schematic configuration of an example of a positioning system using a global positioning system (GPS) satellite, that is, a frequency signal generation system.

FIG. 11 is a diagram illustrating a schematic configuration of an example of a positioning system using a global positioning system (GPS) satellite, that is, a frequency signal generation system.

A positioning system 1100 illustrated in FIG. 11 is configured to include a base station apparatus 1300 and a GPS receiving apparatus 1400. Here, an electronic device equipped with the atomic oscillator 1 can also be called a frequency signal generation system, and various systems composed of a plurality of electronic devices including the electronic device equipped with the atomic oscillator 1 can also be called the frequency signal generation system.

A GPS satellite 1200 transmits a satellite signal (GPS signal) including positioning information.

For example, the base station apparatus 1300 includes a receiving device 1302 that receives the satellite signal from the GPS satellite 1200 via an antenna 1301 installed in a GPS continuous observation station as an electronic reference point, and a transmitting device 1304 that transmits the positioning information, that is acquired by the receiving device 1302 from the received satellite signal, via an antenna 1303.

Here, the receiving device 1302 includes the atomic oscillator 1 that is a reference frequency oscillation source, and a processor 1302*a* which processes a frequency signal from the atomic oscillator 1. The positioning information received by the receiving device 1302 is transmitted by the transmitting device 1304 in real time.

As such, the receiving device 1302 that is the frequency signal generation system includes the atomic oscillator 1. According to such a receiving device 1302, the characteristics of the receiving device 1302 can be improved by reducing the temperature gradient around the atom cell 201 of the atomic oscillator 1. By including the receiving device 1302 described above, it is possible to improve the characteristics of the positioning system 1100 that is another example of the frequency signal generation system.

The GPS receiving apparatus 1400 includes a satellite receiver 1402 which receives positioning information from the GPS satellite 1200 via an antenna 1401, and a base station receiver 1404 which receives positioning information from the base station apparatus 1300 via an antenna 1403.

As described above, the receiving device 1302 of the positioning system 1100 as an example of the frequency signal generation system includes the atomic oscillator 1 and the processor 1302*a* which processes the frequency signal from the atomic oscillator 1.

The atomic oscillator 1 includes the atom cell 201 that includes the first portion 201A and the second portion 201B at a position different from the first portion 201A and contains alkali metal atoms, the light emitting element 102 that emits light LL for exciting the alkali metal atoms toward the atom cell 201, the temperature sensor 213 that is a first temperature measurement element for measuring the temperature of the first portion 201A, the temperature control element 212 that is a first temperature control element for controlling the temperature of the first portion 201A based on the measurement result of the temperature sensor 213, the second temperature measurement element that is disposed in a portion having thermal resistance equal to or higher than the thermal resistance between the first portion 201A and the second portion 201B and measures the temperature of the portion, the heater 203 that is a second temperature control element that controls the temperature of the second portion 201B to be higher than the temperature of the first portion 201A based on the measurement result of the second temperature measurement element or information on temperature control performed by the temperature control element 212, that is, in this embodiment, based on the measurement result of the second temperature measurement element, and the light receiving element 202 that receives the light LL transmitted through the atom cell 201.

As described in the fourth embodiment, the atomic oscillator 1 can be configured to include the atom cell 201 that includes the first portion 201A and the second portion 201B at a position different from the first portion 201A, and contains alkali metal atoms, the light emitting element 102 that emits light LL for exciting the alkali metal atoms toward the atom cell 201, the temperature sensor 213 that is a first temperature measurement element that measures the temperature of the first portion 201A, the temperature control element 212 as a first temperature control element for controlling the temperature of the first portion 201A based on the measurement result of the temperature sensor 213, the heater 203 as a second temperature control element for controlling the second portion 201B to a temperature higher than the temperature of the first portion 201A with a predetermined output value, and the light receiving element 202 that receives the light LL transmitted through the atom cell 201.

According to the disclosure described above, it is possible to improve the characteristics of the positioning system 1100 and the receiving device 1302 by taking advantage of the atomic oscillator 1 described above.

The frequency signal generation system is not limited to that described above, and may be any system including the atomic oscillator 1 and a processor that processes the frequency signal from the atomic oscillator 1. For example, the frequency signal generation system can be applied to a smartphone, a tablet terminal, a timepiece, a mobile phone, a digital still camera, an ink jet ejection device (for example, ink jet printer), a personal computer (mobile personal computer and laptop personal computers), a TV, a video camera, a video recorder, a car navigation device, a pager, an electronic notebook (including communication function), an electronic dictionary, a calculator, an electronic game device, a word processor, a workstation, a video phone, a crime prevention TV monitor, electronic binoculars, a point of sales (POS) terminal, medical equipment (for example, an electronic thermometer, a blood pressure monitor, a blood glucose meter, an electrocardiogram measuring device, an ultrasonic diagnostic device, an electronic endoscope), a fish finder, various measuring instruments, instruments (for example, instruments of a vehicle, an aircraft, and a ship), a flight simulator, terrestrial digital broadcasting, a mobile phone base station, and the like. The frequency signal generation system configured to include a plurality of electronic devices or the like may be any system that generates a signal by processing a signal from the atomic oscillator 1, and is not limited to the one described above, and may be a clock transmission system, for example.

As described above, although the illustrated embodiments of the atomic oscillator and the frequency signal generation system according to the present disclosure are described, the present disclosure is not limited thereto, and each part constituting the atomic oscillator and the frequency signal generation system can be replaced with any part having a configuration that can exhibit the same function. Moreover, any constituent element may be added.

In the embodiments described above, although the case where the present disclosure is applied to an atomic oscillator using the quantum interference effect is described as an example, the present disclosure is not limited thereto, and can be applied to an atomic oscillator using a double resonance phenomenon. In this case, the light source is not limited to a semiconductor laser, and for example, a light emitting diode, a lamp enclosing alkali metal, or the like can be used.

What is claimed is:

1. An atomic oscillator comprising:
    an atom cell that includes a first portion and a second portion at a position different from the first portion, and contains alkali metal atoms;

a light emitting element that emits light for exciting the alkali metal atoms toward the atom cell;

a first temperature measurement element that measures a temperature of the first portion;

a first temperature control element that controls the temperature of the first portion;

a second temperature control element that controls a temperature of the second portion;

a temperature control circuit that controls the first temperature control element and the second temperature control element based on a measurement result of the first temperature measurement element so that the temperature of the second portion is higher than the temperature of the first portion; and a light receiving element that receives light transmitted through the atom cell.

2. The atomic oscillator according to claim 1, wherein
a control signal determined based on a calibration curve indicating a relationship between the measurement result and a control signal of the second temperature control element is input to the second temperature control element.

3. The atomic oscillator according to claim 1, wherein
a control signal determined based on a calibration curve indicating a relationship between the information on temperature control performed by the first temperature control element and a control signal of the second temperature control element is input to the second temperature control element.

4. An atomic oscillator comprising:
an atom cell that includes a first portion and a second portion at a position different from the first portion, and contains alkali metal atoms;

a light emitting element that emits light for exciting the alkali metal atoms toward the atom cell;

a first temperature measurement element that measures a temperature of the first portion;

a first temperature control element that controls the temperature of the first portion;

a second temperature measurement element that is disposed in a portion having a thermal resistance equal to or higher than a thermal resistance between the first portion and the second portion, and measures a temperature of the portion;

a second temperature control element that controls a temperature of the second portion;

a temperature control circuit that controls the first temperature control element and the second temperature control element based on a first measurement result of the first temperature measurement element and a second measurement result of the second temperature measurement element so that the temperature of the second portion is higher than the temperature of the first portion;

a light receiving element that receives light transmitted through the atom cell; and a shield that has a magnetic shielding property and contains the atom cell, wherein the first temperature measurement element is disposed inside the shield, and the second temperature measurement element is disposed outside the shield.

5. An atomic oscillator comprising:
an atom cell that includes a first portion and a second portion at a position different from the first portion, and contains alkali metal atoms;

a light emitting element that emits light for exciting the alkali metal atoms toward the atom cell;

a first temperature measurement element that measures a temperature of the first portion;

a first temperature control element that controls the temperature of the first portion;

a second temperature control element that controls a temperature of the second portion and that operates under a constant energization condition;

a temperature control circuit that controls the first temperature control element based on a measurement result of the first temperature measurement element; and a light receiving element that receives light transmitted through the atom cell.

* * * * *